United States Patent [19]

Nelson et al.

[11] Patent Number: 4,995,941
[45] Date of Patent: Feb. 26, 1991

[54] METHOD OF MANUFACTURE INTERCONNECT DEVICE

[75] Inventors: Gregory H. Nelson, Gilbert, Ariz.; Sanford Lebow, Westlake Village, Calif.; Eugene Nogavich, Gilbert, Ariz.

[73] Assignee: Rogers Corporation, Rogers, Conn.

[21] Appl. No.: 352,112

[22] Filed: May 15, 1989

[51] Int. Cl.[5] .......................... B44C 1/22; C23F 1/02; B29C 37/00; C03C 15/00
[52] U.S. Cl. .................................. 156/630; 29/827; 156/633; 156/634; 156/643; 156/644; 156/656; 156/659.1; 156/668; 156/902; 156/247; 156/272.8; 156/289; 219/121.69; 219/121.71; 357/70; 428/131; 428/209; 428/901
[58] Field of Search ............ 156/629, 247, 630, 633, 156/272.8, 634, 289, 643, 644, 645, 652, 655, 656, 659.1, 664, 665, 666, 668, 901, 902; 29/827, 846, 852, 874; 430/313, 314; 174/68.5; 361/406, 421; 427/96, 97; 437/220, 182, 228; 219/121.68, 121.69, 121.7, 121.71, 121.85; 357/69, 70; 428/596, 601, 131, 209, 901

[56] References Cited
U.S. PATENT DOCUMENTS

| | | |
|---|---|---|
| 4,159,222 | 6/1979 | Lebow et al. .................. 156/632 |
| 4,306,925 | 12/1981 | Lebow et al. .................. 156/150 |
| 4,357,203 | 11/1982 | Zelez .............................. 156/643 |
| 4,420,364 | 12/1983 | Nukii et al. .................... 156/901 X |
| 4,473,737 | 9/1984 | Anthony ..................... 219/121 LL |
| 4,568,632 | 2/1986 | Blum et al. ..................... 430/322 |
| 4,598,039 | 7/1986 | Fischer et al. ................. 430/323 |
| 4,642,160 | 2/1987 | Burgess ........................... 156/630 |
| 4,685,998 | 8/1987 | Daniel et al. .................. 156/901 X |

FOREIGN PATENT DOCUMENTS 0256778 2/1988 European Pat. Off. .

Primary Examiner—William A. Powell
Attorney, Agent, or Firm—Fishman, Dionne & Cantor

[57] ABSTRACT

An interconnect device for electronic components, such as integrated circuits, multichip modules and the like, and the method of manufacture thereof are presented. The interconnect device has two layers of circuitry, one for signal transmission and one for voltage plane. The interconnect device is made by a processing on a stainless steel carrier plate to achieve high lead count capability with fine line widths and spacing, as well as precise registration layer to layer. Laser drilling is used to define interconnect vias between signal and voltage (power or ground) plane layers.

19 Claims, 11 Drawing Sheets

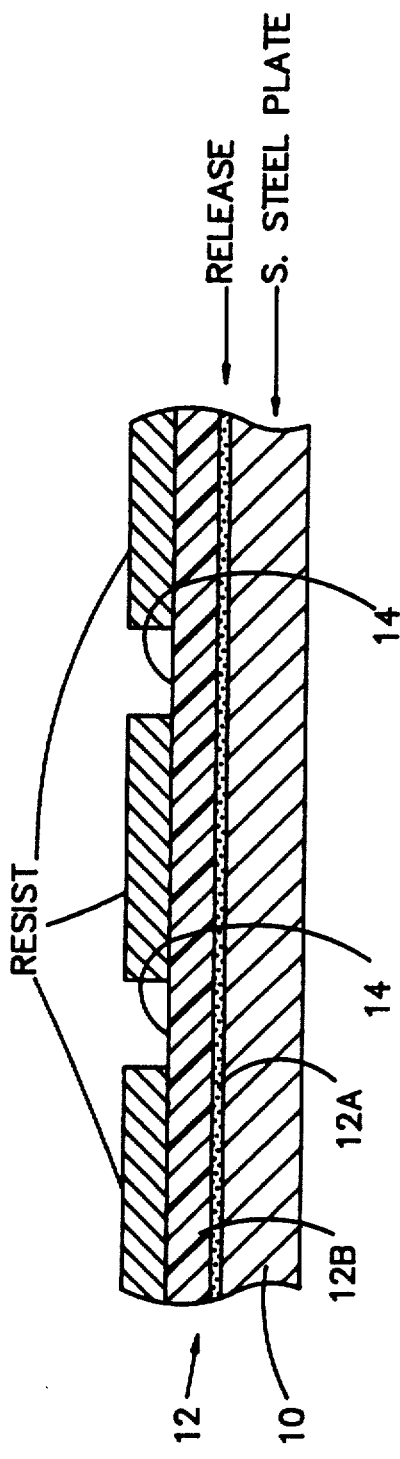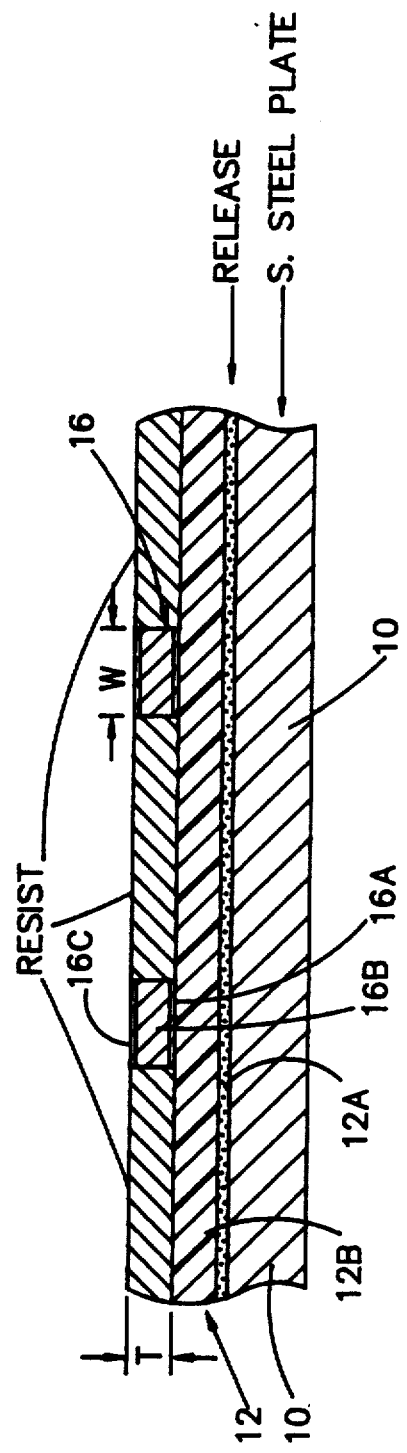

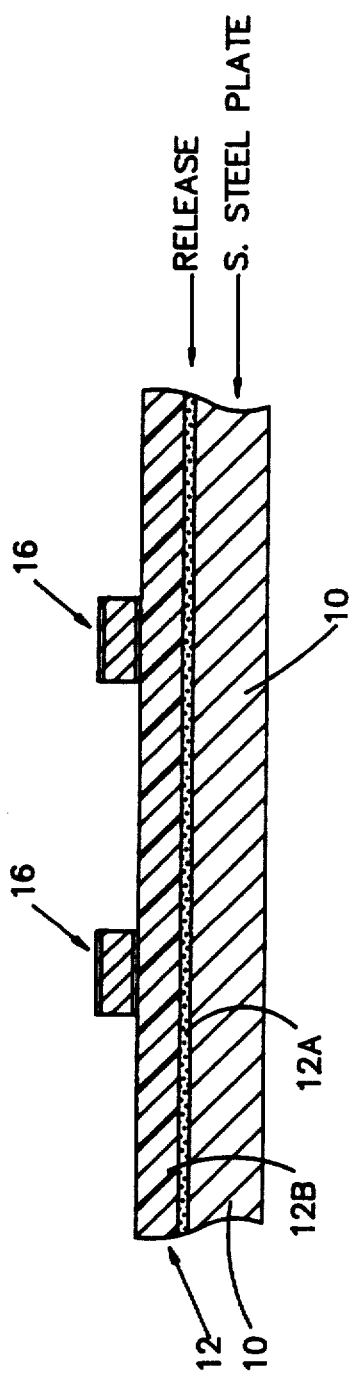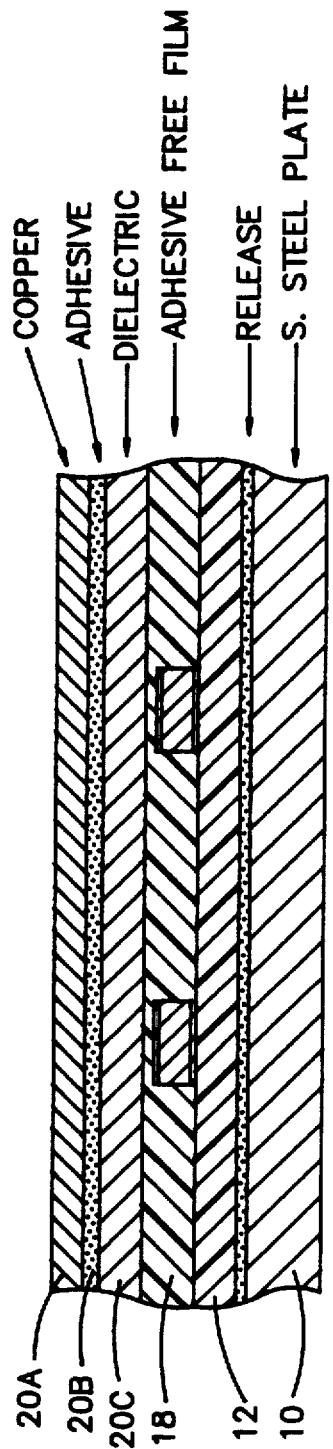

METHOD OF MANUFACTURE INTERCONNECT DEVICE

BACKGROUND OF THE INVENTION

In recent years there has been an increased requirement for high lead count interconnect devices, especially for high density electrical components such as integrated circuits, multichip modules, etc.

In recent years the packaging of integrated circuits (ICs) has evolved from conventional devices such as the dual in-line package (DIP) to a variety of devices such as surface mounted ICs. This evolution has led to the need for interconnect devices to connect the ICs to other circuitry. Various devices have been proposed and used to effect such interconnection, such as wire bonding and tape automated bonding (TAB) products.

As this field of technology has developed, the requirements for the number of leads to connect the IC to external circuitry has increased. That is, there is a growing requirement for interconnect devices that are sometimes referred to as high lead count devices. There is a need in the art for high lead count in the range of 300 or more. As the lead count increases, the requirements for the interconnect device become more difficult. For a given size IC device, higher lead counts mean that the interconnect device must have finer lead widths, finer spacing between leads and better control of line width. There is a need in the art for three or even two mil pitch, i.e. 1½ or 1 mil line width and 1½ or 1 mil spacing, respectively. The prior art is not capable of producing commercially attainable product having such lead count and pitch. Also, since the inner leads of the device (i.e., the leads to be connected to the IC device) are supported in a cantilever manner prior to connection to the IC device, a high lead count imposes increased requirements for maintaining the center to center spacing between the leads, maintaining registration with the desired points of contact on the IC and maintaining lead planarity. Many high lead count ICs have requirements for interconnect devices with impedance control to reduce mismatched impedance of signal lines. In addition, with fine pitch of leads, signal crosstalk also becomes a problem. Similarly, there are requirements for high lead count interconnection devices for other electronic components, such as high density multichip modules, to interconnect the electronic components to other circuit components such as a printed circuit board. Such high lead count interconnect devices may have problems and requirements similar to those discussed above.

SUMMARY OF THE INVENTION

The present invention will be described primarily in the context of an interconnect device for an IC sometimes referred to in the art as a high lead count tape automated bonding (TAB) product. However, it will be understood that the invention has more general utility, particularly in the manufacture of high lead count interconnect devices for high density electronic components in general.

The present invention addresses the problems discussed above in a new and improved interconnect device and method of manufacture thereof. While the present invention is particularly suitable for and intended to be a high lead count device (e.g., in the range of 300 or more leads), and will be described in that context, it should also be understood that the features and advantages of both the process and the end product of the present invention can also be employed in similar interconnect devices that do not have high lead count requirements.

The interconnect device of the present invention has fine lead widths, fine spacing between leads, and close control of lead width. The center-to-center spacing of the cantilevered inner ends of the leads is maintained to within very tight tolerances, as is registration with the intended points of contact with the IC. The device of the present invention also incorporates a second conductive layer which serves as a voltage (power or ground) plane. The accuracy of line width control and line spacing and the presence of the second conductive layer (i.e., the voltage plane) result in a device with improved impedance control characteristics and reduced signal crosstalk. The technology of the present invention has sufficient resolution to permit signal line densities as fine as 1 mil line widths on 2 mil centers. This resolution has not been achievable in a practicable basis heretofore. The completed device of the present invention is also a self supporting interconnect structure.

The above described and other features and advantages of the present invention will be understood by those of ordinary skill in the art from the following detailed description and drawings.

BRIEF DESCRIPTION OF THE DRAWINGS

Referring to the drawings, wherein like elements are numbered alike in the several FIGURES:

FIGS. 3-8 are partial sectional elevation views as if taken along line A—A of FIG. 2 but showing the status of the device at different stages of manufacture.

DESCRIPTION OF THE PREFERRED EMBODIMENT

Figure 1:
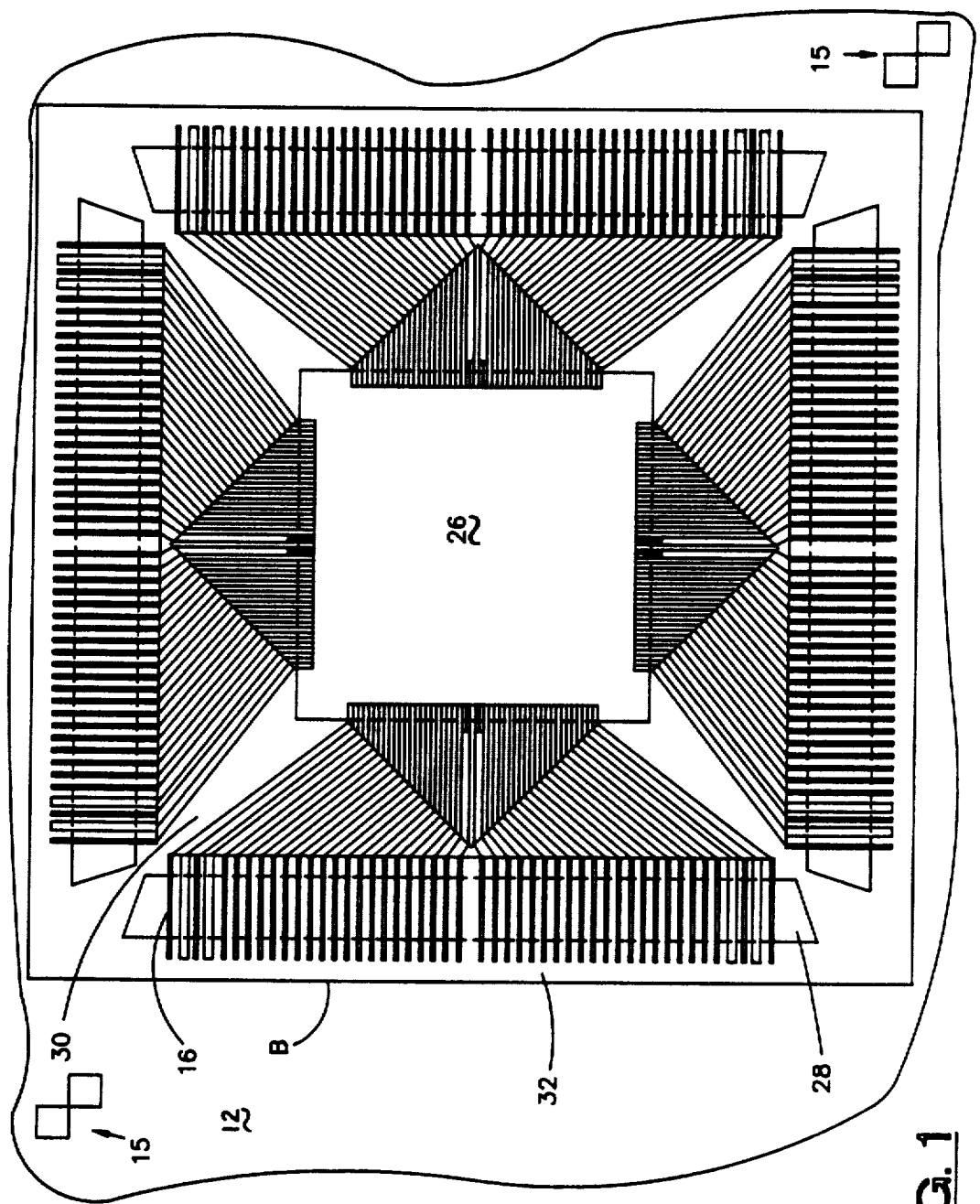
FIG. 1 is a plan view of an interconnect device in accordance with the present invention viewed from the bottom in the manufacturing process (the bottom when positioned for use).

The interconnect device of the present invention and its method of manufacture are illustrated in the drawings. To facilitate an understanding of the invention, both the device and its method of manufacture will be described in a combined consideration of FIGS. 1-11.

Figure 12:
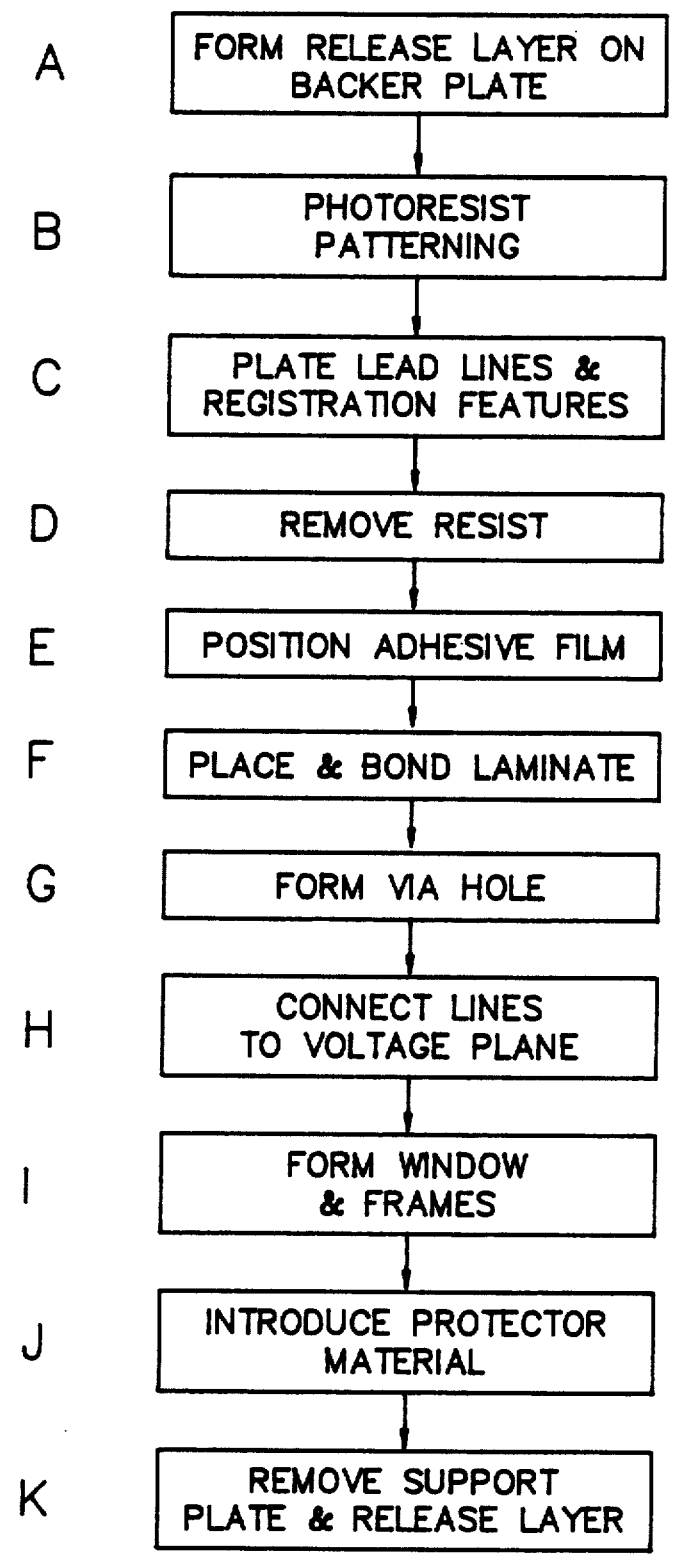
FIG. 12 is a block diagram of the manufacturing process of the present invention.

Referring first to FIGS. 3 and 4, a stainless steel carrier or base plate 10 and a release layer 12 form the support structure on which a plurality of interconnect devices are formed in the manufacturing process. Base plate 10 can be of other materials, the requirement being that it be flat, dimensionally stable, and have a highly polished surface. While a plurality of interconnect devices are formed on carrier plate 10, Only one such device is shown and described herein. It will, however, be understood that a plurality of such interconnect devices are all formed at the same time on the surface of plate 10. Plate 10 is of sufficient thickness to form a rigid and secure carrier for the manufacturing process to assist in precise line control, as will be discussed hereinafter. Release layer 12 consists of a thin layer 12(a) of nickel electroplated to plate 10 and a thicker layer 12(b) of copper electroplated on top of the nickel layer. Since neither the nickel nor the copper are strongly adherent to the stainless steel plate (thus constituting a release layer relative to the stainless steel plate), the layers of nickel and copper are formed to extend over the entire surface of plate 10 (only a portion of which is shown in the drawings) and to wrap around the sides of plate 10 and to extend a short distance along the back (i.e., bottom) surface. This serves to lock the release layer to the stainless steel plate to give dimensional stability to the stainless steel plate/release layer structure for the manufacturing process, while permitting easy release of stainless steel plate 10 from release layer 12 when it is desired to do so near the end of the manufacturing process. Release layer 12 is about 1 mil. (0.001") thick. The step of forming release layer 12 on stainless steel plate 10 is indicated at step A in FIG. 12.

For the next step in the manufacturing process, a standard photoresist process is employed to define lines on the upper surface of release layer 12 on which copper leads 16 are to be formed. That is, a resist material is deposited on the upper surface of release layer 12, and the resist layer is then photoexposed through suitable artwork to define a pattern of areas (i.e., over the surfaces 14) where undeveloped resist is washed away, and the rest of the upper surface of layer 12 remains covered with photoresist. As a final step in this photoresist patterning, a plasma etch cleaning step is performed to clean out the areas where the photoresist has been washed away to obtain sharp, clean, fine leads. The photoresist, with portions removed to define the surfaces 14 is shown in FIG. 3. This photoresist patterning step is indicated at step B in FIG. 12.

Figure 2:
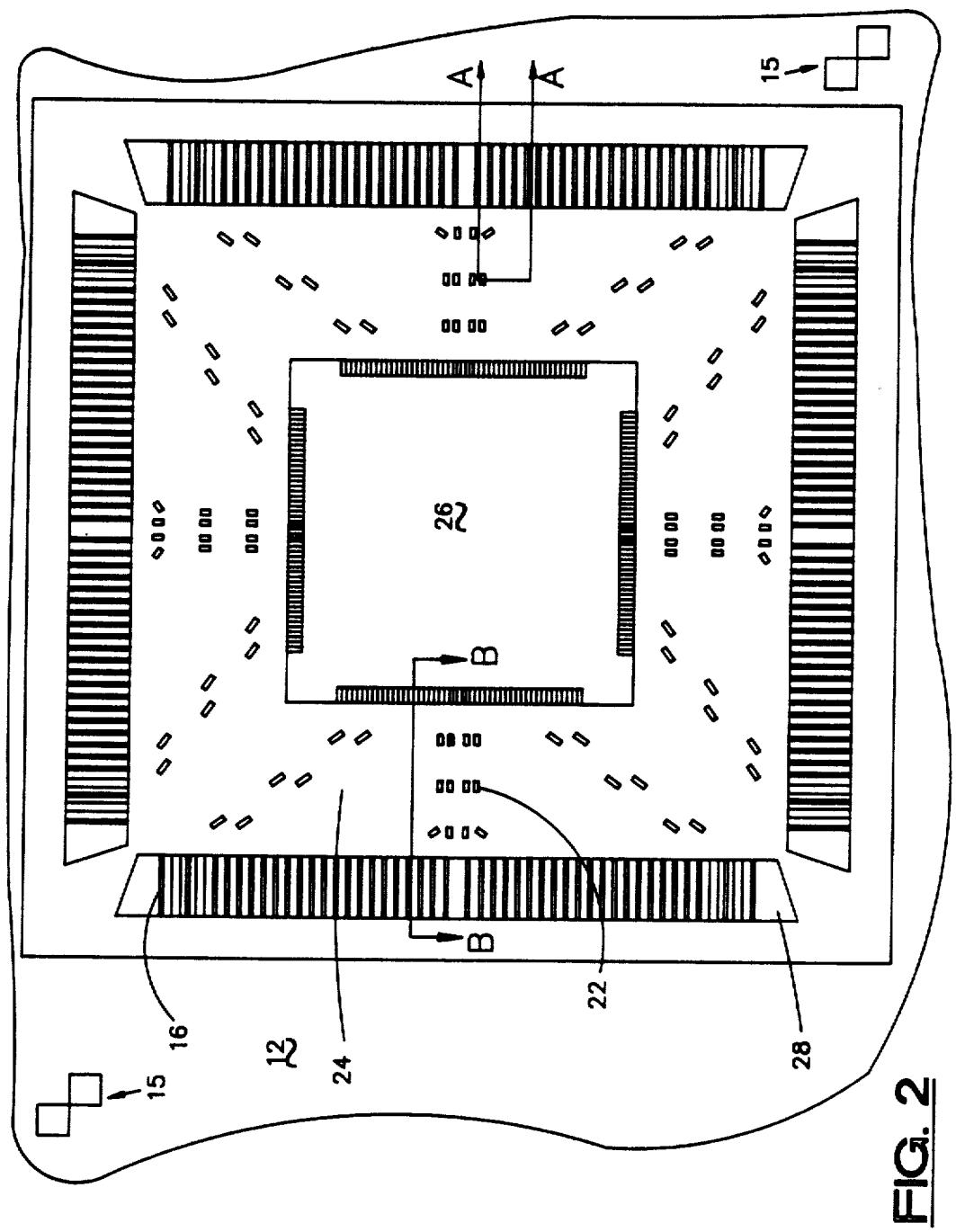
FIG. 2 is a plan view of the device of FIG. 1 rotated 180° to reverse the top and bottom surfaces.

Leads 16 are then formed by electroplating on the surfaces 14. A three step electrodeposition process is used whereby each lead 16 is formed first by electroplating a thin layer 16A of gold on surface 14, then electroplating a main layer of copper 16B and then electroplating another thin layer 16C of gold. Other electroplatable metals such as tin or nickel, may be used instead of the gold layers 16A, 16C. The total thickness "T" of each lead 16 is about 0.001"; and the width "W" of each lead and the spacing therebetween may be as fine as 1 to 2 mils (0.001"-0.002"). It will be understood that FIG. 4 is a partial view and that only two of the leads 16 are shown in FIG. 4 for purposes of illustration. The entire device may have in the range of 300 or more leads. Thus, for a single device, such as shown in FIGS. 1 and 2, having 80 leads per side, there would be a total of 320 leads 16. The step of pattern plating leads 16 is indicated at step C in FIG. 12. The remaining resist material on the surface of release layer 14 is then removed to leave exposed leads on the upper surface of layer 14. The resist removal step is indicated at step D in FIG. 12. FIG. 4 shows the electroplated leads 16 with the resist still in place, and FIG. 5 shows the manufacturing stage where the resist has been removed.

As an integral part of the photoresist patterning of step B and the plating of step C, a plurality of registration features 15 (see FIGS. 1 and 2) are also located and formed on release layer 12 to serve as markers for accurate location of via holes in a later stage of the manufacturing process. A number of such registration features 15 are formed on release layer 12 over the expanse of plate 10, to serve as registration markers for all of the interconnect devices formed at the same time in the manufacturing process, but only two are shown in FIGS. 1 and 2.

A free film adhesive 18 which is activated by heat and pressure is then placed on top of the leads 16. The adhesive film is activated by heat and pressure; it may be, e.g., a phenolic butaryl epoxy known as 8970 available from Rogers Corporation, the assignee hereof. Initially this free film is supported on top of the leads 16 and does not surround the leads as shown in FIG. 6. This step of positioning the adhesive film is indicated at step E in FIG. 12. Next, a single clad laminate 20 of copper bonded to an insulating substrate is placed on top of adhesive film 18, and heat and pressure are applied to bond the laminate 20 to the leads 16 and to release layer 12 as shown in FIG. 6. Laminate 20 may, e.g., be a layer of ½oz. copper 20A bonded by a layer of adhesive 20B (e.g., 8970 identified above) to a layer of polyimide 20C. Other laser etchable dielectrics such as fluoropolymer composites, fluorimides, polyamide-imides, etc. may be used instead of polyimide. It is important to position the laminate 20 so that the copper layer 20A faces away from leads 16. The application of heat and pressure causes the free film adhesive layer 18 to flow around and between the leads 16 as shown in FIG. 6. The step of placing the laminate 20 and bonding it are indicated at step F in FIG. 12. Free film 18 and laminate 20 are prepunched with holes to align with the registration features 15 to leave the registration features visible from the top of the assembly for accurate location of the vias in a subsequent step in the manufacturing process.

Figure 7:
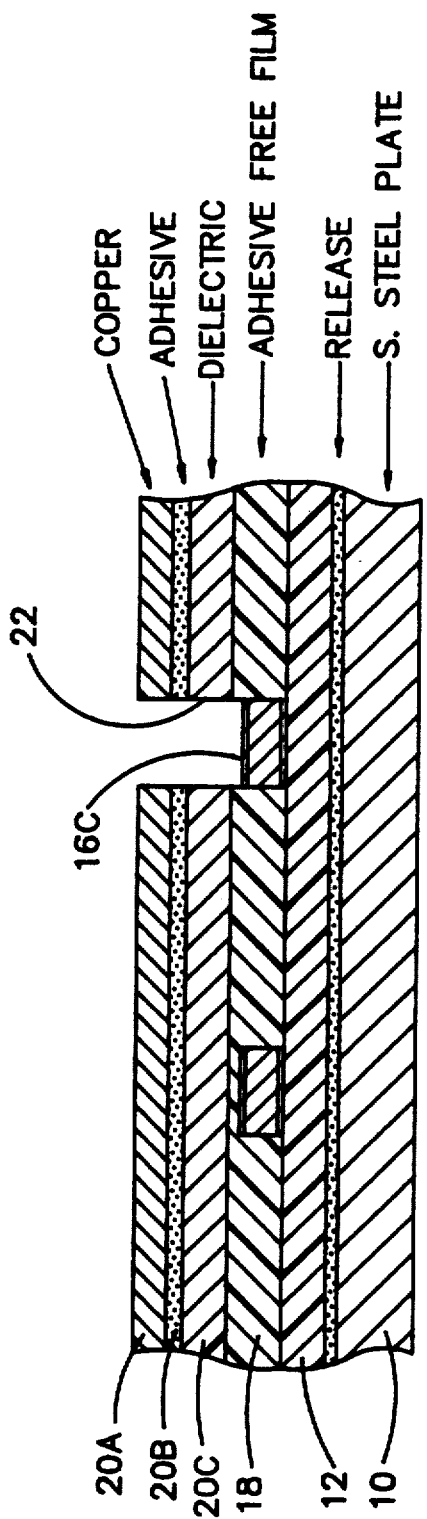

After laminate 20 has been bonded to the assembly, a series of via holes 22 are formed in the assembly to permit electrical contact to be made with leads 16C. Only one via hole is shown in FIG. 7, but it will be understood that as many via holes as desired can be formed. Preferably, a via will be formed to connect to each lead 16 which will serve as voltage lines in the final assembly of the interconnect device to an IC or other electronic component. A layer of photoresist is applied to copper layer 20A, and the photoresist is photographically exposed and developed to remove the photoresist only in locations where the vias are to be formed. The location of the areas where the photoresist is to be removed is accurately determined by reference to previously formed registration features 15. Bearing in mind the fine line (0.002" width or less) of the leads 14 and the fine spacing (0.002" or less), it will be appreciated that the via hole 22 must be accurately located, and the presence of the registration features 15 makes it possible to do so. After the photoresist has been removed at the locations of the vias, the copper in layer 20A at the via locations is removed by etching to expose adhesive layer 20B. The remaining photoresist is then stripped to expose all of the remaining copper surface 20A. The adhesive layer 20B, the dielectric layer 20C and the adhesive layer 18 in the via path are then all removed by a suitable laser beam (such as a $CO_2$ or UV laser) acting as a drill. The exposed copper layer 20A constitutes a mask for the laser drill. The laser scans the surface 20A with no effect except in those locations where the copper in layer 20A has been etched away to expose adhesive layer 20B. At those locations, the laser beam drills (ablates) through the dielectric materials of layers 20B, 20C and 18 to expose the plated surface 16C of lead 16. The via holes 22 are then cleaned by any standard technique (e.g., plasma cleaning, vapor honing, etc.) to define sharp and clean walls in the via holes and a clean exposed surface at layer 16C. The step of forming the via holes is indicated at step G in FIG. 12.

Figure 8:
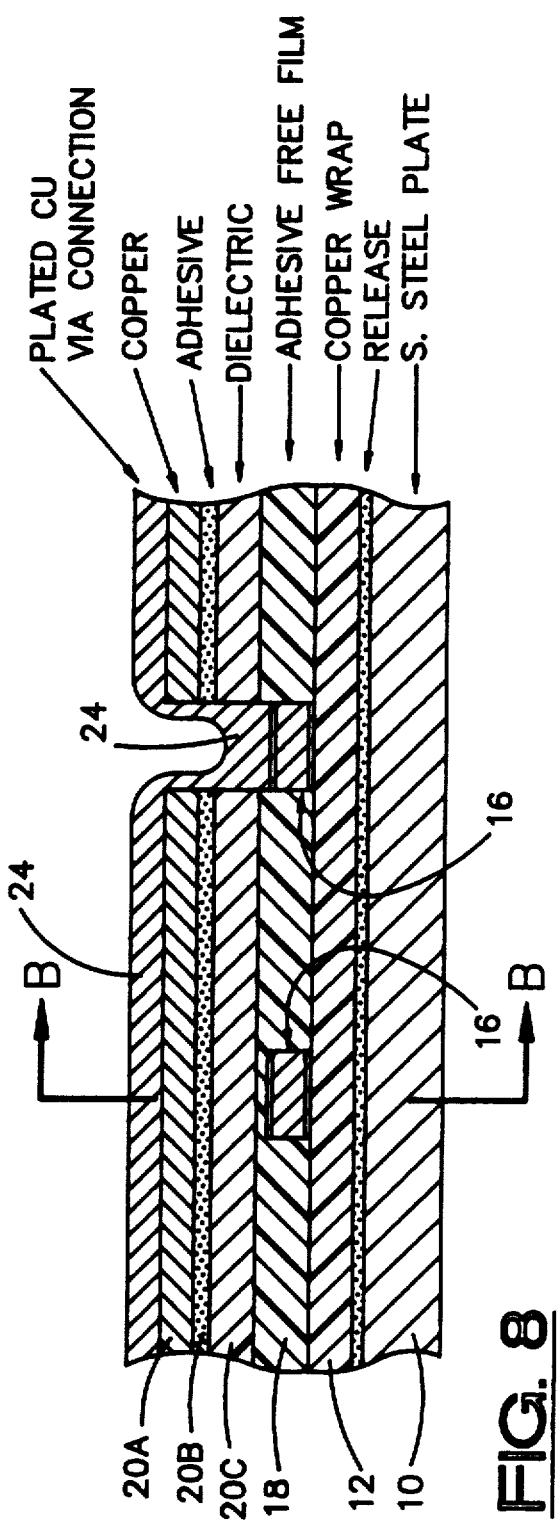

Referring to FIG. 8, copper 24 is then plated to lead 16, along the walls of via holes 22 and to the exposed surface of copper layer 20C to complete the via and form an electrical connection from lead 16 to copper layer 20A which serves as a power or ground plane in the final product. Copper layer 24 is formed in a two step process where first a very thin layer of copper is formed by electroless deposition, and then the remainder of layer 24 is formed by electroplating. The total thickness of layer 24 is about ½ mil (0.0005"). The formation of layer 24 to connect the leads to the power or ground plane is indicated at step H in FIG. 12.

Figure 9:
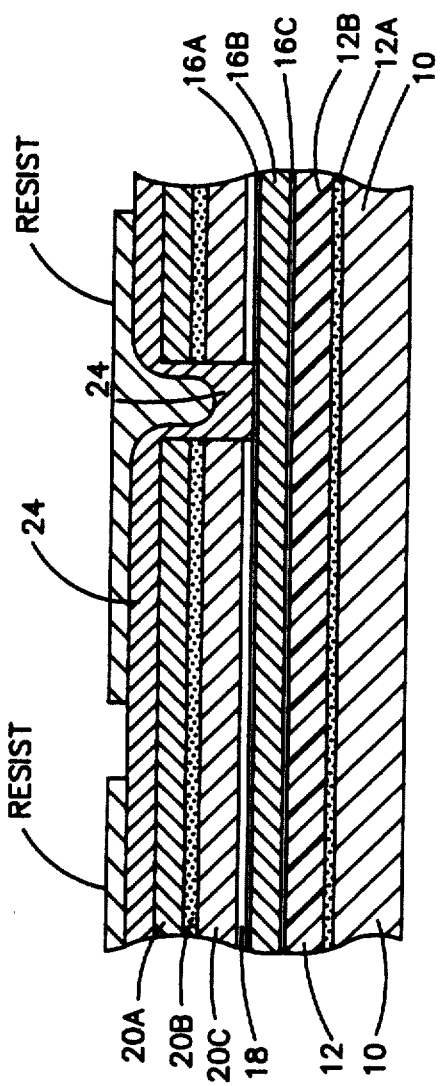
FIGS. 9-11 are partial sectional elevation views taken along line B—B of FIGS. 2 and 8 (line B—B is also shown in FIG. 8 to clarify that FIGS. 9-11 are taken at a mid place in a lower layer lead in the device).

Another layer of photoresist is then applied to copper layer 24, and the photoresist is exposed and developed to define inner and outer windows or void areas 26 and 28, respectively, to be formed in the device (see FIGS. 1 and 2). The photoresist is removed to expose copper layer 24 only in those areas where the windows 26, 28 are to be formed, and the exposed copper in layer 24 and layer 20A is then etched to remove the copper. The exposed resist prior to etching of exposed copper layer 24 and copper layer 20A is shown in FIG. 9. After the copper is etched, the photoresist is stripped from the remainder of copper layer 24, and, as with the formation of the vias in step G, the layers of adhesive 20B, dielectric 20C and adhesive 18 are ablated by the laser to remove those layers all the way down to leads 16 and to copper release layer 12 in those areas where the leads 16 are not present. Copper layer 24 again acts as a drill mask for the laser for this ablation step. The windows 26, 28 can be seen in FIGS. 1, 2 and 10. The formation of windows 26, 28, leaves an inner support frame 30 for support of leads 16 and an outer support frame 32 on which the leads terminate. It will be understood that the frames 30 and 32 are formed out of the laminate structure of layers 18, 20 and 24. The formation of windows 26, 28 and frames 30, 32 are indicated at step I of FIG. 12.

Leads 16 are supported by inner frame 30 and extend into window 26. In the end use of the product, an integrated circuit or other electronic component will be positioned in window 26 and will be connected to the innermost ends of leads 16. In ultimate use, after the electronic component has been placed in window 26 and attached to the leads, the outer ends of the leads will be severed at a predetermined location between inner frame 30 and outer frame 32, and the outer ends of leads 16 will then be connected to circuitry with which the electronic component (in window 26) is to be connected and used.

After the windows 26, 28 and frames 30, 32 have been formed, the windows are filled with a fugitive protective material 34 (see FIG. 11) which surrounds the leads and extends down to release layer 12 to protect the leads during further processing and handling. This protective material, which should have mechanical and chemical integrity, many, e.g., be a resist material that is either water or solvent soluble. The protective material may remain in place during storage and/or shipment of the device until the device is used (i.e., until the electronic component is attached to it). The introduction of the protective material is indicated at step J in FIG. 12.

After step J, the carrier plate 10 is removed by (a) breaking the wrap of release layer 12 and (b) separating the carrier 10 from release layer 12. This can be done manually since, as previously discussed, release layer 12 is not strongly adherent to plate 10. After removal of plate 10, release layer 12 remains bonded to leads 16 and adhesive film 18, so it remains necessary to remove release layer 12. This is done by (a) etching away all of nickel layer 12A and then (b) etching away all of copper layer 12B. That leaves the lower surface (gold plated surface 16A) of the leads 16 exposed. This etching is accomplished by the use of two standard etches, the first being specific for nickel and the second being specific for copper. The removal of the support plate 10 and release layer 10 is indicated at step K in FIG. 12.

Upon the removal of plate 10 and release layer 12, the resulting structure consists of a multiplicity of the interconnect devices joined together in a single sheet-like structure. The individual parts are then excised from the sheet-like structure by any convenient means, such as die cutting, laser cutting, etc. The final parts would be as shown in FIGS. 1, 2, 10 and 11, but without carrier 10 and release layer 12. Of course, protective material 34 will be removed before the part is put into use.

If desired, the gold layer 16A may be removed by selective etching and replaced by other metals, such as tin or solder, for alternate termination processing if desired.

The resulting interconnect device is a product which can achieve the following features and advantages:

(1) Fine line width of 2 mils (0.002") or less.
(2) Fine spacing between leads—the spacing being 2 mils (0.002") or less.
(3) Center-to-center control of the cantilevered lead ends to within about ±0.0003".
(4) Positioning of the cantilevered ends of the leads to a tolerance of about ±0.002 to registration features.
(5) Lead planarity (i.e., alignment in a plane within a tolerance of about ±0.001".
(6) An interconnect device of the lead frame or TAB type with a voltage plane.
(7) Impedance control and low crosstalk realized by the presence of the voltage plane and the close control over lead width and spacing.

Of course, it is possible to practice the method of this invention under less than optimum process control conditions and produce the product of this invention which does not achieve some or all of the above features and advantages. Such product and process would, nevertheless, be within the scope of the present invention.

Figure 10:
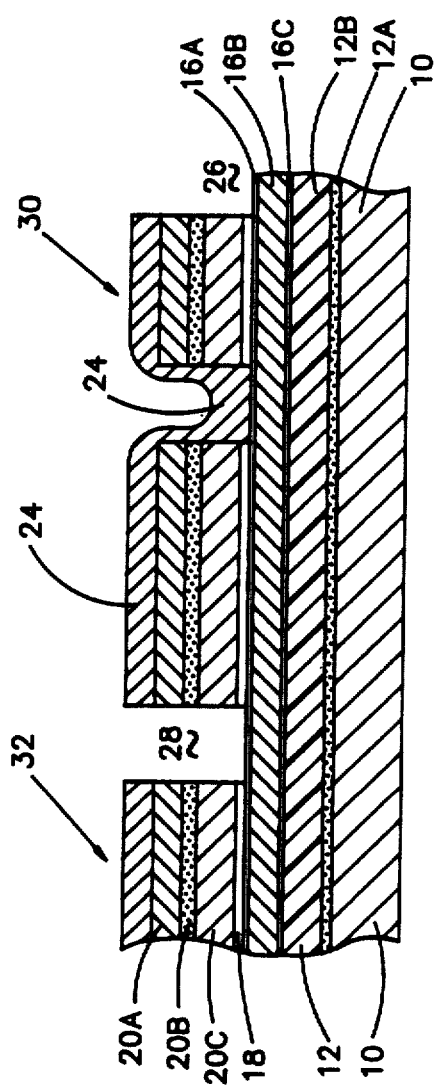
Figure 11:
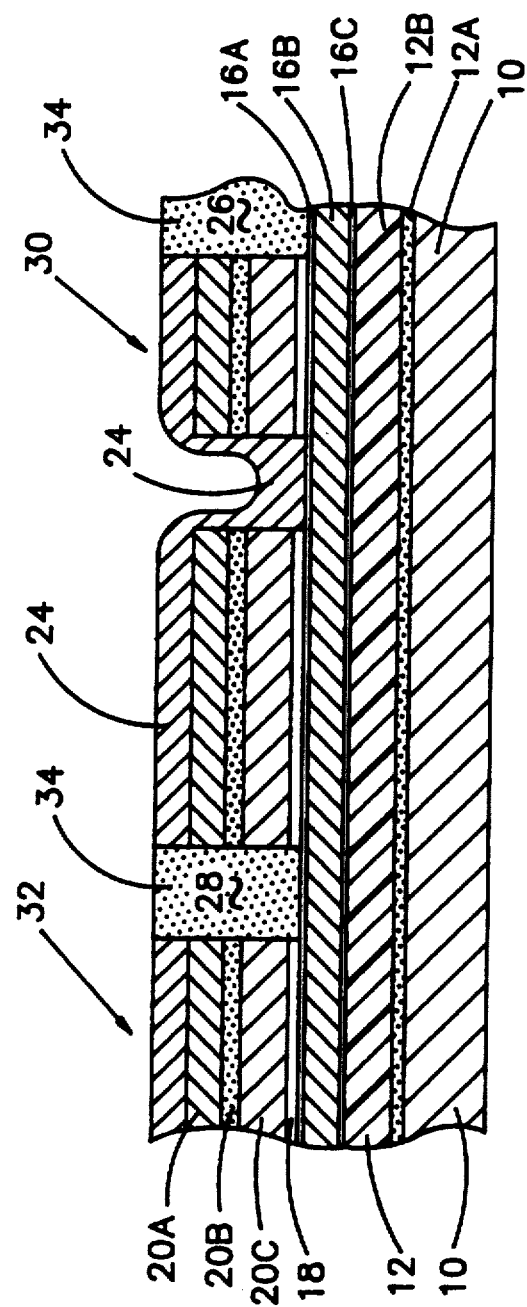
Figure 13A:
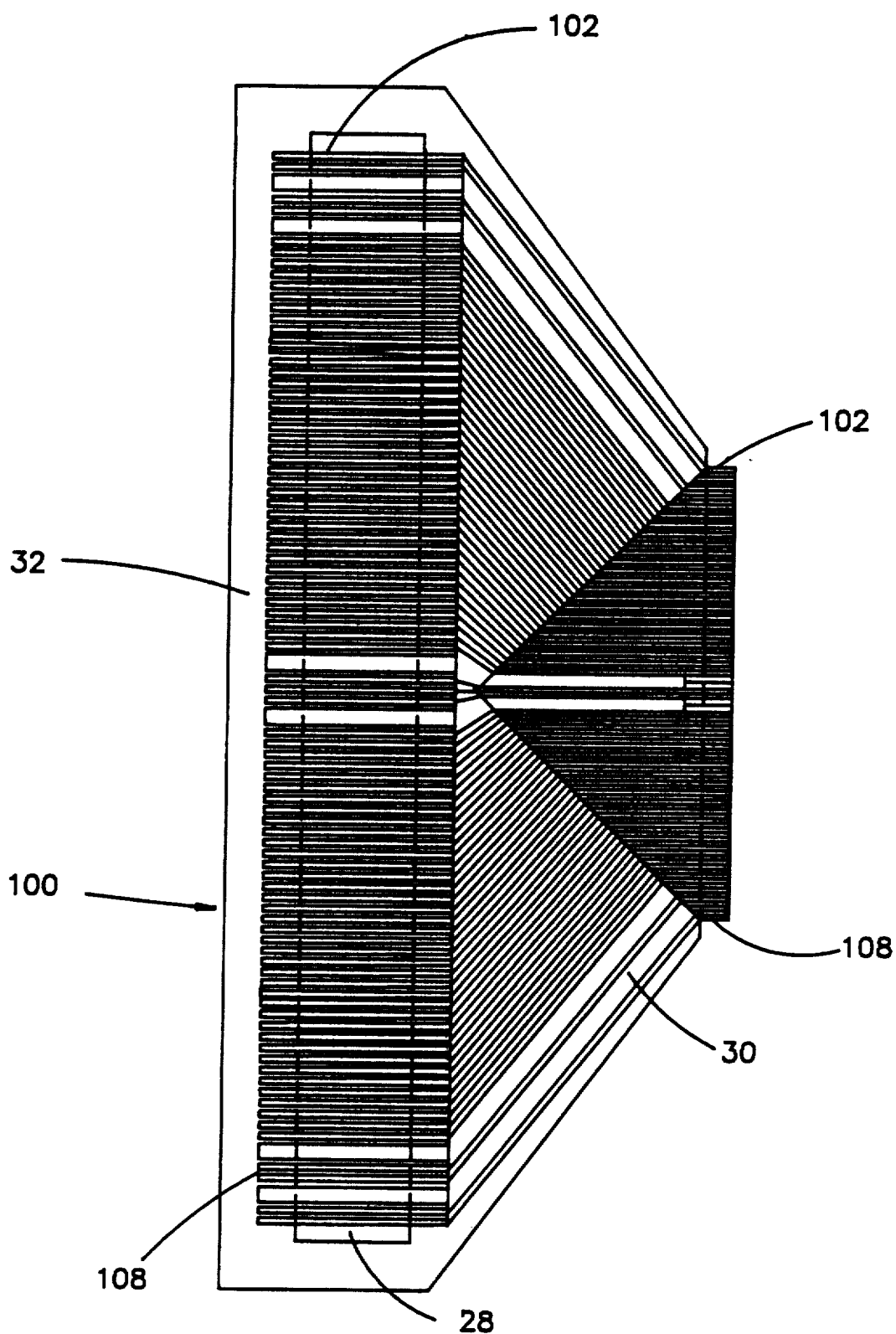
FIG. 13A is a top plan view of another interconnect device made in accordance with the present invention.
Figure 13B:
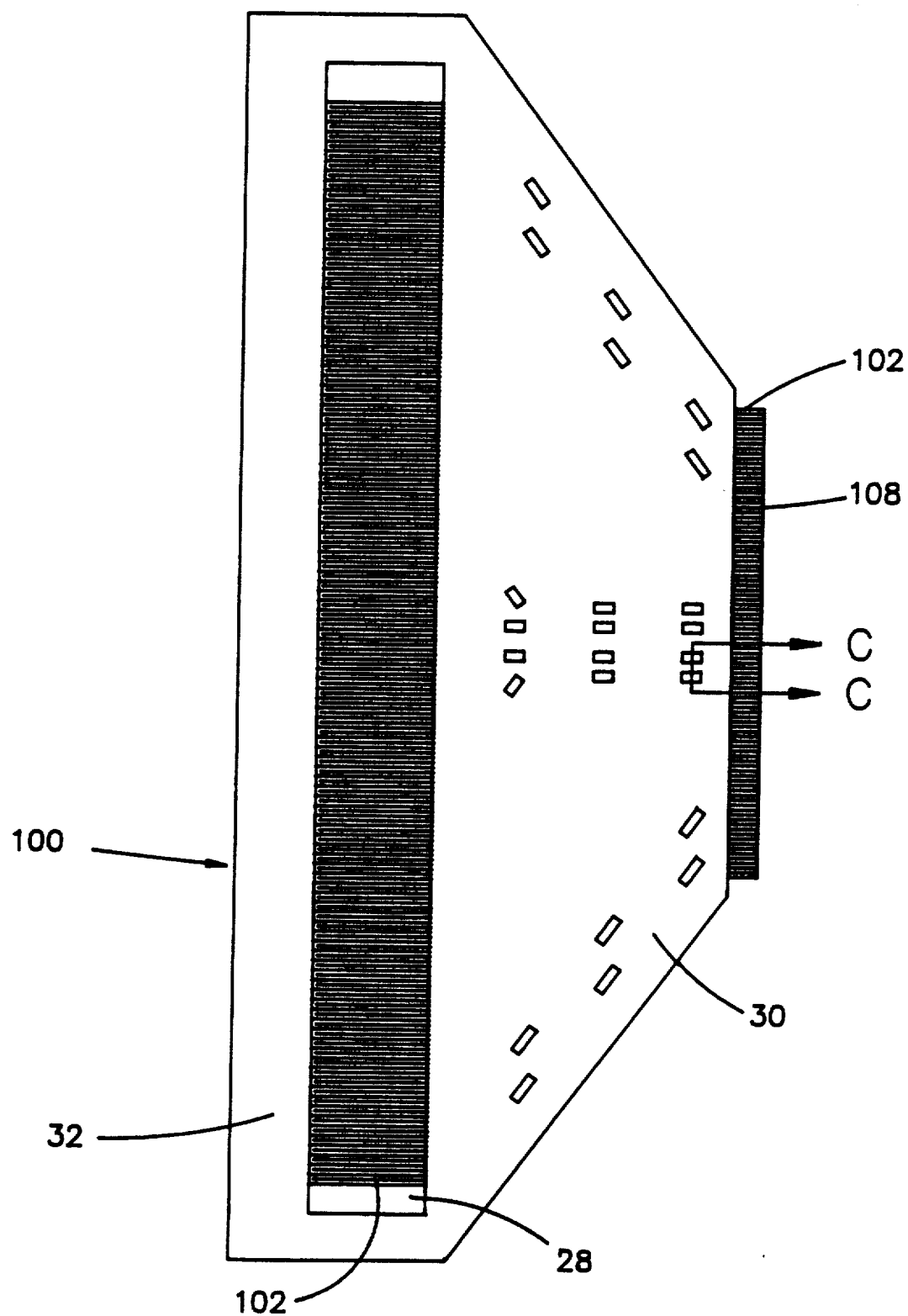
FIG. 13B is a bottom plan view of the device of FIG. 13A.
Figure 14:
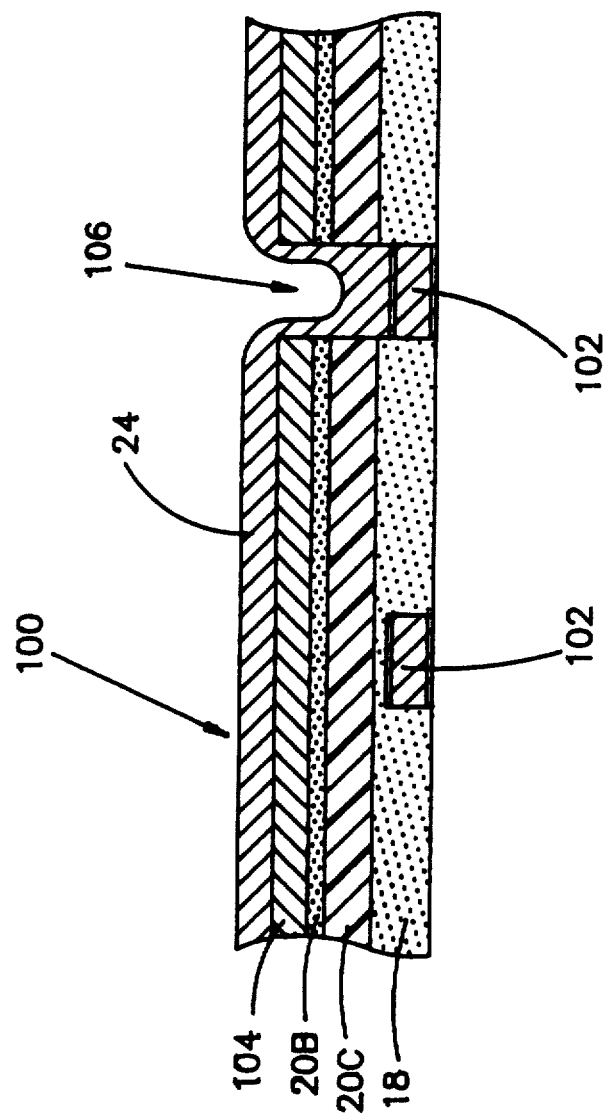
FIG. 14 is a partial sectional elevation view taken along line C—C of FIG. 13.

FIGS. 13A, 13B and 14 show another interconnect device made in accordance with the present invention. The item of FIGS. 13A and 13B is a high density interconnect device 100 for connecting a high density multichip module to a printed circuit board. The individual leads 102 (which are like leads 16) are seen on the upper surface of the device in FIG. 13A. As seen in the cross-section elevation view of FIG. 14, interconnect device 100 also has a voltage or ground plane 104 (corresponding to layer 20A) and conductive vias 106 (corresponding to vias 22) which connect the plane 104 to selected ones of the leads 102. One of the ends 108 of the leads 102 are unsupported (i.e., they extend from interconnect device 100 in a cantilevered manner), and these unsupported lead ends form the actual interconnects to contact points on a high density multichip module. The other ends of the leads (which extend across the equivalent of window 28 and would be severed at some intermediate point for use) are for connection to a PC board. Other parts of the device of FIGS. 13 and 14 are labeled with numbers the same as the corresponding parts in the previous embodiment as shown in FIGS. 1, 2 and 10. The device of FIGS. 13 and 14 is also made by the process of steps A-K of FIG. 12.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of making an interconnect drive for electronic components comprising the steps of:
   forming a release layer on a carrier plate;
   forming a conductive pattern of leads on said release layer;
   forming registration features on said release layer;
   bonding a laminate to said conductive pattern of leads by a layer of adhesive, said laminate including a conductive sheet and a dielectric sheet wherein said dielectric sheet faces said conductive pattern of leads and said conductive sheet faces away from said adhesive layer;
   forming via holes in said laminate in a predetermined pattern, said via holes extending through said conductive sheet, dielectric sheet and adhesive layer to expose said leads;
   depositing conductive material in said via holes and onto said conductive sheet of said laminate to interconnect said leads to said conductive sheet;
   forming at least one window in said device by removing selected parts of said conductive material, said laminate and said adhesive layer, said window extending through said dielectric sheet and adhesive layer to expose said leads; and
   forming at least one frame spaced from and surrounding said window in said device by removing selected parts of said conductive material, said laminate and said adhesive layer, said frame extending through said dielectric sheet and adhesive layer to expose said leads.

2. The method of claim 1 wherein:
   said carrier plate comprises stainless steel.

3. The method of claim 1 wherein:
   said release layer comprises at least one layer of metal plated on a front surface of said carrier plate.

4. The method of claim 3 wherein said carrier plate includes sides and a back surface and wherein:
   said release layer is wrapped around said sides and extends along a portion of said back surface.

5. The method of claim 3 wherein said release layer comprises:
   a first layer of nickel electroplated to said carrier plate; and
   a second layer of copper electroplated to said first layer of nickel.

6. The method of claim 1 wherein said step of forming said conductive pattern of leads comprises the steps of:
   depositing a layer of resist material on said release layer;
   removing parts of said release layer at locations where said leads are to be formed;
   forming a pattern of resist material on said release layer;
   depositing conductive material on said release layer to form said leads at said locations; and
   removing the remainder of resist material.

7. The method of claim 6 wherein said step of depositing said conductive material to form said leads comprises the step of:
   electroplating a first layer of gold, tin or nickel;
   electroplating a second layer of copper on said first layer; and
   electroplating a third layer of gold, tin or nickel on said second layer.

8. The method of claim 1 wherein:
   said adhesive layer is activated by heat and pressure.

9. The method of claim 1 including the step of:
   pre-punching registration holes in said adhesive layer and laminate for alignment with said registration features on said release layer.

10. The method of claim 1 wherein said step of forming via holes comprises:
    forming a pattern of resist material on said conductive layer;
    removing resist material at locations at which vias are to be formed;
    etching said conductive layer at said locations to remove material from said conductive layer and define a mask of said conductive layer with openings therein.

11. The method of claim 1 wherein said step of forming said via holes comprises:
    laser etching through said dielectric sheet and said adhesive layer using said conductive sheet as a mask to laser etch at said openings.

12. The method of claim 1 wherein said step of depositing conductive material in said via holes comprises:
    electroless depositing a first conductive layer in said via holes; and
    electroplating a second conductive layer on said first conductive layer.

13. The method of claim 12 wherein said electroplated second conductive layer covers said conductive sheet of said laminate and wherein said steps of forming said window and frame include the step of:
    removing corresponding second and third portions of said electroplated second conductive layer at the locations of said window and frame.

14. The method of claim 13 wherein said steps of forming said window and frame comprise:
    laser etching through said dielectric sheet and said adhesive layer using said electroplated second conductive layer as a mask.

15. The method of claim 1 including:
    depositing protective material in said window and frame.

16. The method of claim 1 including:
    removing said carrier plate and release layer from said conductive pattern of leads.

17. The method of claim 16 wherein said release layer comprises electroplated metal and wherein said step of removing said release layer includes:
    etching said electroplated metal.

18. An interconnect device for electronic components formed by the process of claim 1.

19. The method of claim 1 wherein said step of bonding a laminate to said conductive pattern of leads includes:
    positioning an adhesive between said dielectric sheet and said conductive pattern of leads.

* * * * *